(12) United States Patent
Park et al.

(10) Patent No.: US 6,569,721 B1
(45) Date of Patent: May 27, 2003

(54) METHOD OF MANUFACTURING A THIN FILM TRANSISTOR TO REDUCE CONTACT RESISTANCE BETWEEN A DRAIN REGION AND AN INTERCONNECTING METAL LINE

(75) Inventors: Won-Kyu Park, Kyonggi-do (KR); Dong-Hwan Kim, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/435,750

(22) Filed: Nov. 8, 1999

(30) Foreign Application Priority Data

Dec. 19, 1998 (KR) .............................. 98-56446

(51) Int. Cl.⁷ ............................................ H01L 31/336
(52) U.S. Cl. ................. 438/151; 438/300; 438/533; 438/586; 438/608
(58) Field of Search ................. 438/151, 300, 438/533, 586, 597, 608, FOR 347, FOR 349, FOR 196, FOR 184

(56) References Cited

U.S. PATENT DOCUMENTS

| 5,747,379 A | * 5/1998 | Huang et al. |
| 5,840,618 A | * 11/1998 | Kondo |
| 5,847,410 A | 12/1998 | Nakajima |
| 6,271,122 B1 | * 8/2001 | Wieczorek et al. |
| 6,303,422 B1 | * 10/2001 | Abe et al. |

FOREIGN PATENT DOCUMENTS

| JP | 08-186264 | 7/1996 |
| JP | 09-203911 | 8/1997 |

* cited by examiner

*Primary Examiner*—George Fourson
*Assistant Examiner*—Joannie Adelle Garcia
(74) *Attorney, Agent, or Firm*—Birch, Stewart, Kolasch & Birch, LLP

(57) ABSTRACT

A thin film transistor includes a low resistance metal film covering a drain region and an interconnecting metal line disposed thereon. Covering the drain region with the low resistance metal film reduces oxidation in the drain region, and thus reduces the contact resistance between the drain region and the interconnecting metal line.

20 Claims, 3 Drawing Sheets

METHOD OF MANUFACTURING A THIN FILM TRANSISTOR TO REDUCE CONTACT RESISTANCE BETWEEN A DRAIN REGION AND AN INTERCONNECTING METAL LINE

BACKGROUND OF THE INVENTION

1. Field of the Invention

The present invention relates to a method of manufacturing a thin film transistor and more specifically, to a method of manufacturing a thin film transistor where the contact resistance between an impurity-doped silicon layer and an interconnecting metal line is reduced. The interconnecting metal line is in contact with the silicon layer and forms both the drain and pixel electrodes.

2. Description of the Background Art

Amorphous silicon (a-Si) TFT LCDs (Thin Film Transistor Liquid Crystal Displays) are increasingly being used in more diverse applications such as notebook PCs and desk top monitors. The growth of the TFT-LCD industry along with wider acceptance of TFT-LCD related applications have occurred because of the improvements in screen resolution and screen size of TFT LCDs. Further, the key to sustaining this growing trend is manufacturing TFT LCDs with greater productivity so that the price of TFT LCDs become more affordable to consumers. To realize significant gains in productivity, the manufacturing process must be simplified, and this can only occur if there is cooperation among all those involved in the manufacture of LCDs.

FIGS. 1A–1D are cross-sectional views illustrating a process manufacturing a thin film transistor according to the prior art.

Figure 1A:
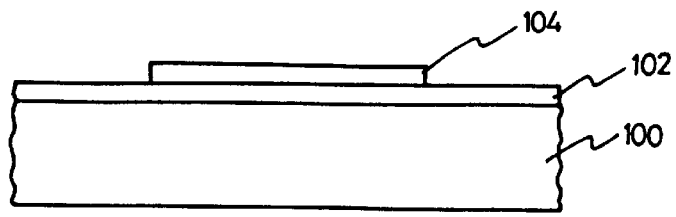

As shown in FIG. 1A, silicon oxide is deposited on an insulating substrate 100 such as glass to form a buffer oxide layer 102. Polysilion is then deposited on the insulating substrate 100 and covers the buffer oxide layer 102. The polysilicon is thereafter patterned via an etching process to form an active layer 104.

Figure 1B:
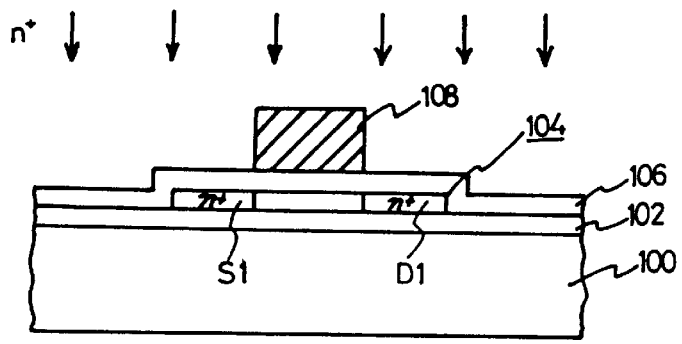

Referring to FIG. 1B, a gate insulating layer 106 is formed on the buffer oxide layer 102 and covers the active layer 104. The gate insulating layer 106 is formed by depositing silicon oxide via chemical vapor deposition (CVD). Next, a gate electrode 108 is formed so as to cover a selected portion of the active layer 104. The gate electrode 108 is created by sputtering a metal such as aluminum or molybdenum to form a metal film, and then patterning the metal film via an etching process.

Thereafter, the entire surface of the insulating substrate 100 is heavily doped with n or p type impurity ions with the gate electrode 108 functioning as a mask. After the doping process, heavily doped impurity regions are formed within the active layer 104 on both sides of the gate electrode 108. These regions serve as a source region S1 and a drain region D1.

Figure 1C:
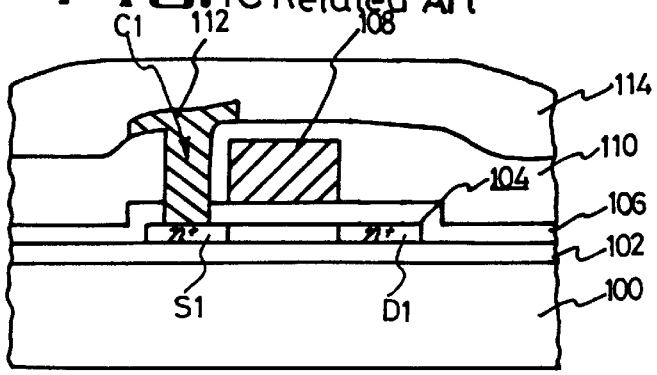

Referring to FIG. 1C, an interlevel insulating layer 110 covers the entire surface of the structure. It is then patterned via an etching process to create a first contact hole c1, which leaves the source region S1 exposed. A source electrode 112 electrically connected to the source region S1 is provided. Next, a protective layer 114 is deposited on the entire surface of the structure.

Figure 1D:
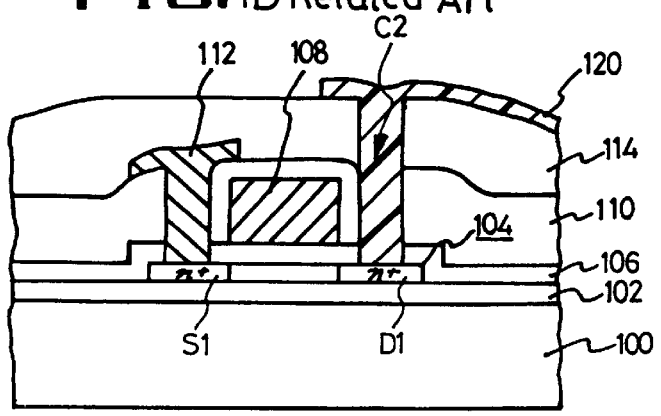

Referring to FIG. 1D, a second contact hole c2 is created within the protective layer 114 and the interlevel insulating layer 110, thus exposing the drain region D1. Thereafter, ITO (Indium Tin Oxide) is deposited on the protective layer 114 and then patterned via an etching process so as to cover the second contact hole c2. This process forms an interconnecting metal line 120. The interconnecting metal line 120 serves both as a pixel electrode and a drain electrode because it is connected to the drain region D1 of the active layer 104.

Thus, in the prior art, the ITO is deposited directly on the drain region to form the interconnecting metal line. The direct contact between the drain region and the ITO causes an increase in the contact resistance between the drain region and the ITO because an oxide layer is formed therebetween. Therefore, a contact failure may occur in the interconnecting metal line when it is connected to the drain region.

SUMMARY OF THE INVENTION

To overcome the problems described above, preferred embodiments of the present invention provide a method for manufacturing a thin film transistor which greatly reduces contact resistance between an impurity-doped silicon layer and an interconnecting metal line without increasing the cost or difficulty of manufacturing the thin film transistor.

According to a preferred embodiment of the present invention, a method for manufacturing a thin film transistor includes providing an exposed drain region on an insulating substrate and covering the exposed drain region with a low resistance metal film.

According to another preferred embodiment, a method for manufacturing a thin film transistor includes forming an active layer on an insulating substrate, forming a gate insulating layer on the active layer, forming a metal film on the gate insulating layer, patterning the metal film to form a gate electrode, forming a source region and a drain region by heavily implanting a first conductivity type impurity into the active layer using the gate electrode as a mask, forming an interlevel insulating layer and exposing the source region by patterning the interlevel insulating layer, forming a source electrode on the source region, forming a protective layer and patterning the protective layer so as to expose the drain region on the interlevel insulating layer, covering the drain region with a low resistance metal film and forming an interconnecting metal line so as to cover the low resistance metal film.

According to another preferred embodiment of the present invention, a method of manufacturing a thin film transistor includes the steps of forming an active layer on an insulating substrate, applying a gate insulating layer on the active layer, sputtering a metal such as aluminum or molybdenum to form a metal film on the gate insulating layer, patterning the metal film to form a gate electrode, forming source and drain regions by heavily implanting impurity ions into the active layer using the gate electrode as a mask, forming an interlevel insulating layer covering the entire surface of the resulting structure and patterning the insulating layer so as to expose the source region, forming a source electrode covering the source region, forming a protective layer and patterning it to expose the drain region on the interlevel insulating layer, depositing a low resistance metal film so as to cover the drain region, and forming an interconnecting metal line that covers the low resistance metal film.

Another preferred embodiment provides a thin film transistor including an insulating substrate, a drain region on the insulating substrate and a low resistance metal film that covers the drain region.

Various other features, elements, and advantages of the present invention will be readily appreciated as the same becomes better understood with reference to the following

BRIEF DESCRIPTION OF THE ATTACHED DRAWINGS

The present invention will become more fully understood from the detailed description provided below and the accompanying drawings which are given by way of illustration only, and thus do not limit the present invention and wherein:

FIGS. 1A–1D are cross-sectional views illustrating a process for manufacturing a thin film transistor according to the prior art; and FIGS. 2A–2E are cross-sectional views illustrating a process for manufacturing a thin film transistor according to preferred embodiments of the present invention.

DETAILED DESCRIPTION OF PREFERRED EMBODIMENTS

FIGS. 2A–2E are cross-sectional views illustrating a process for manufacturing a thin film transistor according to preferred embodiments of the present invention.

Figure 2A:
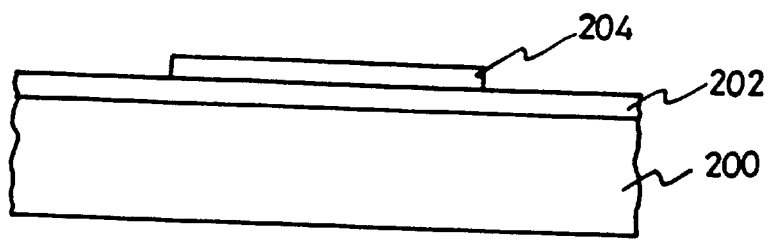

Referring to FIG. 2A, silicon oxide is deposited on an insulating substrate 200 such as glass to form a buffer oxide layer 202. Next, polysilicon is deposited on the buffer oxide layer 202 and then patterned preferably via an etching step so that the patterned polysilicon forms an active layer 204. The buffer oxide layer 202 is provided to suspend defective induction. This can be caused by movement of the silicon component of the polysilicon towards the substrate during deposition of the polysilicon. The buffer oxide layer 202 also is arranged to function as a buffer between the insulating substrate 200 and the active layer 204.

Note that the active layer 204 may also be formed from amorphous silicon instead of polysilicon. However, if amorphous silicon is used to form the active layer 204, the amorphous silicon is instantaneously heated at a high enough temperature to achieve crystallization. This can be achieved with the use of a laser or some other suitable device.

Figure 2B:
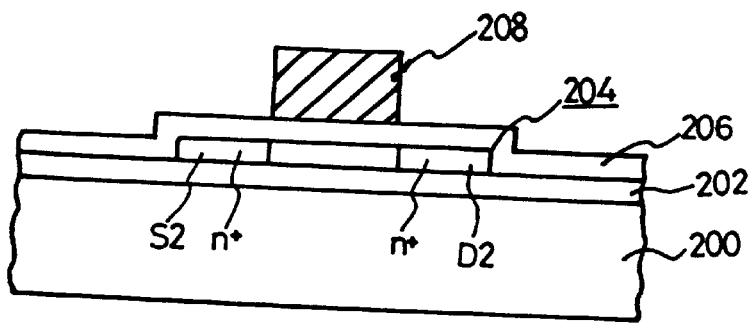

Referring to FIG. 2B, a gate insulating layer 206 is formed on the buffer oxide layer 202 and covers the active layer 204. A metal film is then formed on the gate insulating layer 206 and the active layer 204 preferably by sputtering a metal such as aluminum or molybdenum, or other suitable material. Next, the metal film is patterned preferably via an etching process to cover only a portion of the active layer 204, and thus, the patterned metal layer forms a gate electrode 208.

The gate electrode 208 is used as a mask while n type impurity ions heavily dope the entire surface of the insulating substrate 200. The doping process creates heavily doped impurity regions on both sides of the gate electrode 208 within the active layer 204. These regions serve as source region S2 and drain region D2.

Figure 2C:
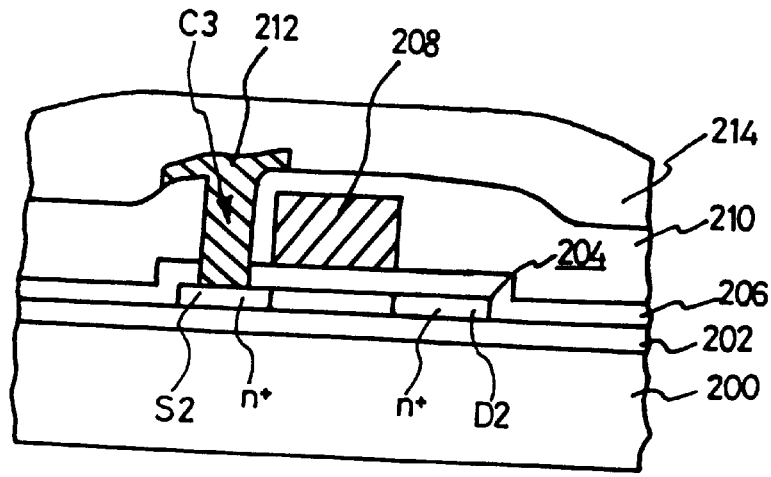

Referring to FIG. 2C, an interlevel insulating layer 210 is formed by covering the entire surface of the structure. The interlevel insulating layer 210 is then etched until the source region S2 of the active layer 204 is exposed. This process forms a first contact hole C3. Next, a metal film is formed on the interlevel insulating layer 210 and covers the first contact hole C3. The metal film is patterned by an etching process so that it is connected to the source region S2, and thus forms the source electrode 212. Thereafter, a protective layer 214 is formed to cover the entire surface of the structure.

Figure 2D:
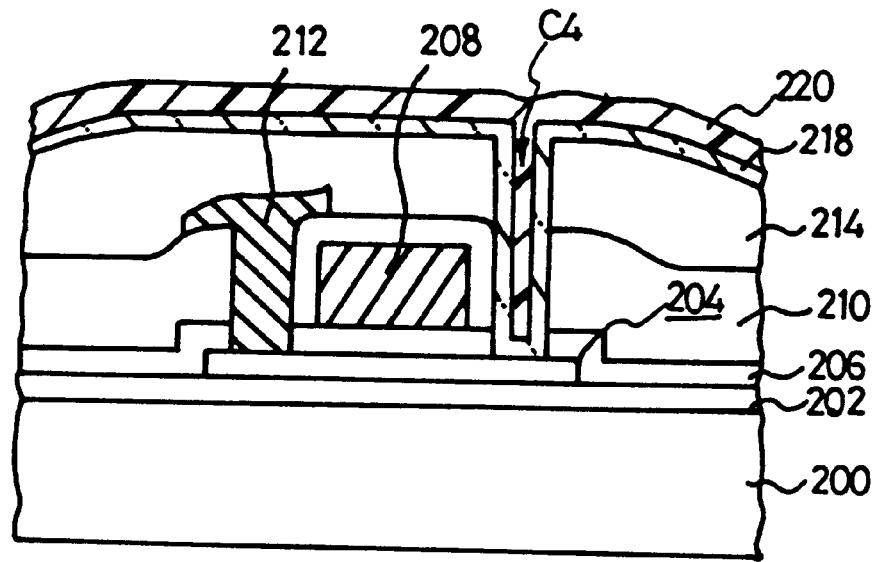

Referring to FIG. 2D, the protective layer 214 is patterned preferably via an etching process to create a second contact hole C4, thus exposing the drain region D2. A metal film 218, hereinafter referred to as the low resistance metal film, made from an In film, Sn film or In/Sn alloy film or other suitable material is formed on the protective layer 214 and covers the second contact hole C4. In this preferred embodiment, the thickness of the low resistance metal film 218 should be in the range of about 100–200 angstroms.

Figure 2E:
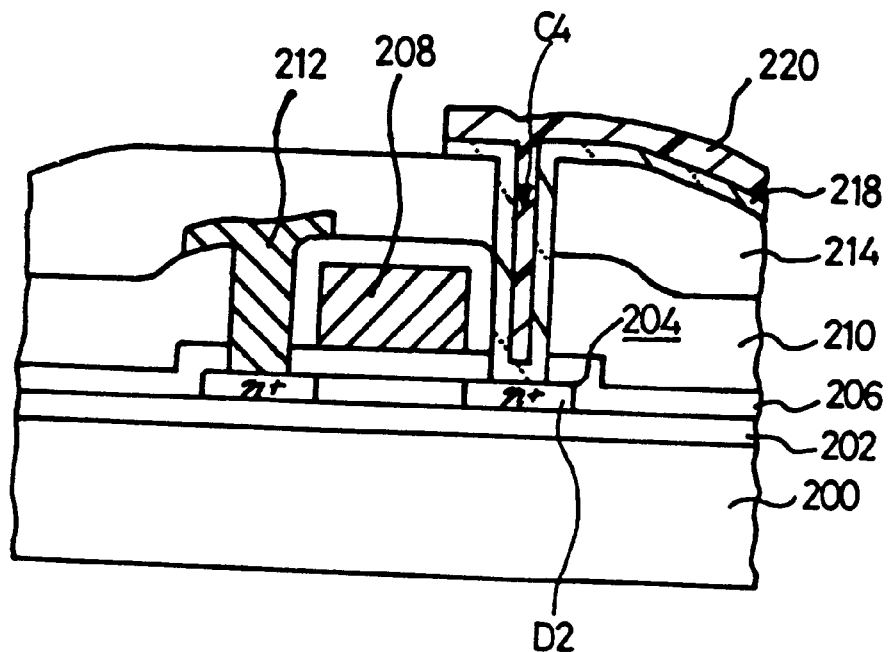

Referring now to FIG. 2E, ITO (Indium Tin Oxide) is deposited on the low resistance metal film 218 preferably via sputtering or chemical vapor deposition. Note, when IZO (Indium Zinc Oxide) instead of ITO is deposited on the low resistance metal film 218, In, Zn or In/Zn alloy may be used for the low resistance metal film. The ITO is then patterned preferably via an etching process to cover the second contact hole C4, and thus forms an interconnecting metal film (conductive material) 220. Finally, the low resistance metal film 218 is now patterned with the conductive material 220 functioning as a mask.

Except for certain portions, the low resistance metal film 218 is oxidized by the oxygen in the atmosphere during ITO deposition and other processes so that it becomes transparent. Further, the conductive material 220 serves both as a pixel electrode and a drain electrode because it is connected to the drain region D2 of the active layer 204.

As described above, the preferred embodiments of the present invention have many advantages over the prior art such as the contact resistance being greatly reduced in the present invention. More specifically, the contact resistance is greatly reduced because the second contact hole C4 is oxidized much less because of the existence of the low resistance film between the impurity-doped silicon layer and the ITO. Further, there is no need for an additional mask because the low resistance metal film is patterned using a photo-mask when forming the interconnecting metal line.

While the invention has been particularly shown and described with reference to preferred embodiments, it will be understood by those skilled in the that the foregoing and other changes in form and details may be made therein without departing from the spirit and scope of the invention.

What is claimed is:

1. A method for manufacturing a thin film transistor comprising the steps of:

forming an active layer on an insulating substrate;

forming a gate insulating layer on the active layer;

patterning a metal layer to form a gate electrode;

forming a source region and a drain region by implanting a first conductivity type impurity into the active layer using the gate electrode as a mask;

forming an interlevel insulating layer and exposing the source region by patterning the interlevel insulating layer;

forming a source electrode on the source region;

forming a protective layer and patterning the protective layer so as to expose the drain region on the interlevel insulating layer;

covering the drain region with a metal film; and forming a conductive material so as to cover the metal film, wherein the conductive material comprises a conductive metal oxide and the metal film contains at least one metal element of the conductive material.

2. The method according to claim 1, wherein the step of forming the metal film further includes the step of patterning the metal film while forming the conductive material.

3. The method according to claim 1, wherein the step of forming the metal film further includes the step of patterning the metal film while the conductive material functions as a mask.

4. The method according to claim 1, wherein the conductive material comprises a pixel electrode.

5. The method according to claim 1, wherein the conductive material comprises a drain electrode.

6. The method according to claim 1, wherein the step of covering the drain with the metal film reduces oxidation of the drain region.

7. The method according to claim 1, wherein the step of forming the conductive material on the metal film reduces the contact resistance between the conductive material and the drain region.

8. A method of manufacturing a thin film transistor comprising the steps of:

providing an exposed drain region on an insulating substrate;

covering the exposed drain region with a metal film, and forming a conductive material on the metal film, wherein the conductive material comprises a conductive metal oxide and the metal film contains at least one metal element of the conductive material.

9. The method according to claim 8, wherein the step of covering the drain region with the low resistance metal film reduces oxidation of the drain region.

10. The method according to claim 8, wherein the step of forming the metal film further includes the step of patterning the metal film while forming the conductive material.

11. The method according to claim 8, wherein the step of forming the metal film further includes the step of patterning the metal film while the conductive material functions as a mask.

12. The method according to claim 8, wherein the conductive material is a pixel electrode.

13. The method according to claim 8, wherein the conductive material is a drain electrode.

14. The method according to claim 8, wherein the step of forming the conductive material on the metal film reduces the contact resistance between the conductive material and the drain region.

15. The method of claim 1, wherein the conductive material is indium tin oxide and the metal film is a member selected from the group consisting of indium, tin and indium/tin oxide.

16. The method of claim 1, wherein the metal film has a thickness of about 100–200 angstroms.

17. The method of claim 8, wherein the conductive material is indium tin oxide and the metal film is a member selected from the group consisting of indium, tin and indium/tin oxide.

18. The method of claim 8, wherein the metal film has a thickness of about 100–200 angstroms.

19. A method for manufacturing a thin film transistor comprising the steps of:

forming an active layer on an insulating substrate;

forming a gate insulating layer on the active layer;

patterning a metal layer to form a gate electrode;

forming a source region and a drain region by implanting a first conductivity type impurity into the active layer using the gate electrode as a mask;

forming an interlevel insulating layer and exposing the source region by patterning the interlevel insulating layer;

forming a source electrode on the source region;

forming a protective layer and patterning the protective layer so as to expose the drain region on the interlevel insulating layer;

covering the drain region with a metal film; and forming a conductive material so as to cover the metal film, wherein the conductive material comprises a conductive metal oxide and the metal film contains at least one element of the conductive material, and wherein the conductive material is indium tin oxide and the metal film is a member selected from the group consisting of indium, tin and indium/tin oxide.

20. A method of manufacturing a thin film transistor comprising the steps of:

providing an exposed drain region on an insulating substrate; and covering the exposed drain region with a metal film, and forming a conductive material on the metal film, wherein the conductive material comprises a conductive metal oxide and the metal film contains at least one element of the conductive material, wherein the conductive material is indium tin oxide and the metal film is a member selected from the group consisting of indium, tin and indium/tin oxide.

* * * * *